(12) United States Patent
Jonsson

(10) Patent No.: US 11,641,129 B2
(45) Date of Patent: May 2, 2023

(54) DC TO DC EDGE DEVICE

(71) Applicant: Sotspor, LLC, Rancho Santa Margarita, CA (US)

(72) Inventor: Karl S. Jonsson, Rancho Santa Margarita, CA (US)

( * ) Notice: Subject to any disclaimer, the term of this patent is extended or adjusted under 35 U.S.C. 154(b) by 310 days.

(21) Appl. No.: 16/824,699

(22) Filed: Mar. 20, 2020

(65) Prior Publication Data
US 2020/0303944 A1 Sep. 24, 2020

Related U.S. Application Data

(60) Provisional application No. 62/822,329, filed on Mar. 22, 2019.

(51) Int. Cl.
*H02J 7/34* (2006.01)
*G01R 19/10* (2006.01)
*H01M 10/48* (2006.01)

(52) U.S. Cl.
CPC .............. *H02J 7/345* (2013.01); *G01R 19/10* (2013.01); *H01M 10/48* (2013.01)

(58) Field of Classification Search
CPC ..................................... H02J 7/345
USPC ....................................... 320/166
See application file for complete search history.

(56) References Cited

U.S. PATENT DOCUMENTS

| | | | |
|---|---|---|---|
| 7,038,399 B2 | 5/2006 | Lys et al. | |
| 7,233,115 B2 | 6/2007 | Lys | |
| 8,398,253 B2 | 3/2013 | Sivertsen | |
| 8,558,413 B1 | 10/2013 | Lepard | |
| 8,975,825 B2 | 3/2015 | Hu | |
| 9,101,032 B2 | 8/2015 | Kim et al. | |
| 9,155,171 B1 | 10/2015 | Hughes et al. | |
| 9,295,142 B1 | 3/2016 | Leinen et al. | |
| 9,338,860 B2 | 5/2016 | Radermacher | |
| 9,430,681 B2* | 8/2016 | Hicks .................. | G07G 1/0081 |
| 10,314,141 B2 | 6/2019 | Harvey et al. | |
| 10,609,797 B1 | 3/2020 | Jonsson | |
| 10,757,791 B1 | 8/2020 | Jonsson | |
| 2006/0168458 A1 | 7/2006 | Stineman et al. | |
| 2015/0048758 A1 | 2/2015 | Carrigan et al. | |
| 2015/0066228 A1* | 3/2015 | Clifton ..................... | G05F 1/66 |
| | | | 700/295 |

(Continued)

FOREIGN PATENT DOCUMENTS

| | | | |
|---|---|---|---|
| WO | 2011055284 A3 | 10/2011 | |
| WO | 2011055284 A9 | 1/2012 | |

OTHER PUBLICATIONS

Hirschmann, Power Over Ethernet, 2011, retrieved from http://belden.picturepark.com/Website/Download.aspx?DownloadToken=73468f0b-3d68-4ec4-a295-81d58eec2bc1&Purpose=AssetManager&mime-type=application/pdf on Mar. 23, 2019.

(Continued)

*Primary Examiner* — Yalkew Fantu
(74) *Attorney, Agent, or Firm* — Young's Patent Services; Bruce A. Young

(57) ABSTRACT

A power distribution system utilizes direct-current (DC) electrical power. A distribution cable carries DC power from a distribution unit to an edge device. The edge device provides a communication connector with DC power for use by a load device. The edge device optionally includes an energy storage device, such as a rechargeable battery, to allow the edge device to provide more power to the load device than it is receiving from the power distribution unit for some period of time.

19 Claims, 4 Drawing Sheets

(56) References Cited

U.S. PATENT DOCUMENTS

| | | | |
|---|---|---|---|
| 2015/0195883 A1 | 7/2015 | Harris et al. | |
| 2015/0316285 A1* | 11/2015 | Clifton | F24D 19/10 236/1 C |
| 2017/0012433 A1* | 1/2017 | Estes | H02S 40/32 |
| 2017/0133879 A1* | 5/2017 | Eckhardt | H02J 13/00004 |
| 2017/0238392 A1 | 8/2017 | Shearer et al. | |
| 2017/0250828 A1 | 8/2017 | Buchanan | |
| 2018/0129257 A1 | 5/2018 | Stewart | |
| 2018/0139823 A1* | 5/2018 | Hick | H05B 47/11 |
| 2018/0177026 A1 | 6/2018 | Bowser et al. | |
| 2018/0183264 A1 | 6/2018 | Crenshaw | |
| 2019/0018473 A1* | 1/2019 | Scalf | H02J 13/00004 |

OTHER PUBLICATIONS

MicroSemi, Next-Generation PoE: IEEE 802.3bt, 2016, retrieved from https://www.microsemi.com/document-portal/doc_view/136209-next-generation-poe-ieee-802-3bt-white-paper on Mar. 23, 2019.

Schindler, Fred, Link Layer Discovery Protocol LLDP, Jan. 2015, retrieved from http://www.ieee802.org/3/bt/public/jan15/schindler_3bt_1_01_15.pdf on Mar. 23, 2019.

Wikipedia, Power Over Ethernet, May 23, 2019, Retrieved from https://en.wikipedia.org/w/index.php?title=Power_over_Ethernet&diff=898449968&oldid=894957528 on Aug. 22, 2019.

Korean Intellectual Property Office, International Search Report for PCT/US2020/024112, dated Jul. 23, 2020.

Korean Intellectual Property Office, Written Opinion of the International Searching Authorigy for PCT/US2020/024112, dated Jul. 23, 2020.

"Part 3: Carrier Sense Multiple Access With Collision Dection (CSMA/CD) Access Method and Physical Layer Specifications Amendment: Data Terminal Equipment (DTW) Power View Media Deependent Interface (MDI)", IEEE STE 802.3AF-2003, Jun. 18, 2003, p. 1-131.

"Power over Ethernet: Cisco Inline Power and IEEE 802.3af", Jan. 1, 2004, Retrieved from http://www.cisco.com/warp/public/cc/so/neso/bbssp/poeie_wp.pdf on May 31, 2006.

* cited by examiner

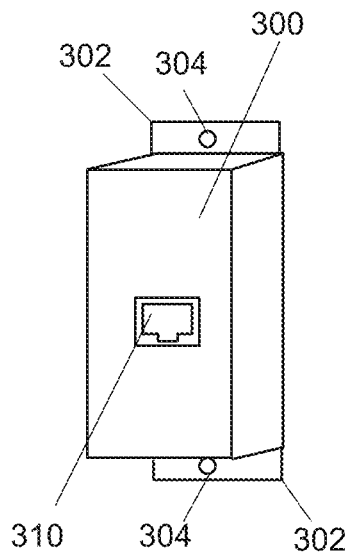
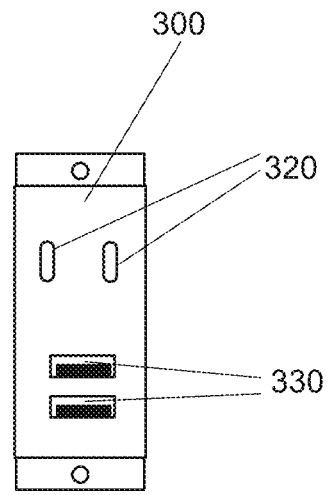
FIG. 3A  FIG. 3B
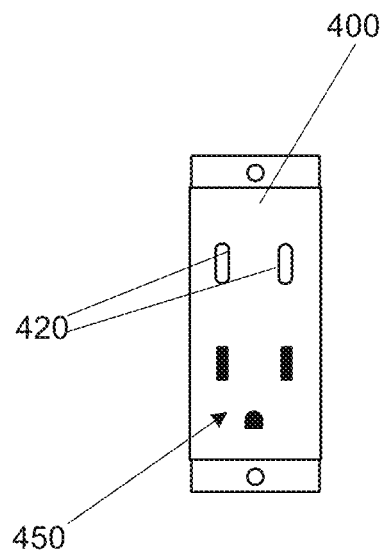
FIG. 4

DC TO DC EDGE DEVICE

CROSS-REFERENCE TO RELATED APPLICATIONS

This application claims the benefit of U.S. Provisional Application 62/822,329 filed Mar. 22, 2019 entitled Power Distribution System, which is incorporated by reference herein for any and all purposes.

BACKGROUND

Technical Field

The present subject matter relates to distribution of direct-current power within a building.

Background Art

The building of infrastructure to distribute electrical energy from large generators run by utilities (either public or private entities) to homes and businesses where the electricity was consumed began in the nineteenth century. Two competing technologies emerged for how the electrical energy should be distributed. One camp, led by Thomas Edison and General Electric, promoted the use of direct current (DC), while another camp, led by Nikola Tesla and George Westinghouse, promoted the use of alternating current (AC). As is the case with many competing technology standards since that time, the battle became quite heated due the large potential profits that were at stake, but by the dawn of the twentieth century, AC power generation and distribution had clearly won, with a vast majority of electrical generation and distribution built over the next 100 years supporting AC, not DC. Thus, the ubiquitous wall outlet in the United States provides AC power and a vast majority of devices that are electrically powered are designed to use AC power unless they use batteries (which provide DC power as their primary power source).

In the United States, 120 volt (V) AC power is commonly distributed to wall outlets using 14 AWG (American wire gauge) which can safely carry up to 15 amps (A) of current although larger wires allowing higher currents are also commonly used, especially 12 AWG wiring supporting up to 20 A. This means that devices requiring up to about 1800 watts (W) can utilize a standard power plug. But while heat-generating devices (e.g. hair dryers, microwave ovens, and space heaters) and devices utilizing powerful motors (e.g. refrigerators, kitchen mixers, and large fans) may approach this limit, other devices that plug into a wall outlet use well below the maximum power available, with many devices consuming 100 W or less and most utilizing under 500 W.

But as the electricity market continues to evolve towards more sustainable solutions with renewable energy and energy storage, local distribution of power in buildings may eventually transform from alternating current (AC) to direct current (DC). This is at least partly due to emerging technologies like improving photo-voltaic electrical generation and improved batteries for energy storage which both operate on DC; it is significantly more efficient to transfer and store generated DC power directly. Another reason for the emergence of DC power distribution is that the end consumption of energy by DC-powered devices continues to grow. One example of this is the emergence of light-emitting diode (LED) based lighting. Lighting has historically been the second biggest consumer of energy after heating, ventilation, and air-conditioning (HVAC) and traditional incandescent and fluorescent lighting can natively utilize AC power. LEDs, however, natively utilize DC power, so LED-based lighting today currently requires AC/DC conversion to operate when powered from the traditional AC power grid, causing inefficiency, heat generation, quality issues when used with traditional dimming devices, and reduced lifetime due to limited life of critical electric components. Operating LED-based lights directly from DC would be more efficient.

The third largest consumers of energy in buildings, especially homes, are electronic devices. Electronic devices are on track to overtake lighting in terms of consumption, especially due to the growth of the internet of things (IoT) and the higher efficiency of LED-based lighting. Electronic devices generally utilize DC power which is generated from the distributed AC power by an AC to DC converter which may be embedded inside the device or provided by an external power supply which has a standard AC plug and a separate cable to provide DC power to the electronic device. While a wide array of connectors may be used for the DC power connection to the electronic device, in many cases a universal serial bus (USB) connector is used as the DC power connector, even if no data connection is supported.

One emerging trend for DC distribution for information technology (IT) equipment, telephones, cameras, and more recently, lighting, is power over Ethernet (PoE). PoE comes in several flavors that mainly are differentiated by power capacity. The Institute of Electrical and Electronics Engineering (IEEE) standard 802.3af was the first PoE standard to be adopted. It specified a way to provide Ethernet data and power up to 15.4 watts (W) through a single cable which was ideal for telephones. IEEE 802.3at come later with capacity up to 30 W and most recently IEEE 802.3bt allows up to 100 to be provided at voltages up to 57 V. There are also proprietary flavors of PoE such as Cisco Systems UPoE.

BRIEF DESCRIPTION OF THE DRAWINGS

The accompanying drawings, which are incorporated in and constitute part of the specification, illustrate various embodiments. Together with the general description, the drawings serve to explain various principles. In the drawings:

FIG. 3A is perspective view of a back of an embodiment of an edge device;

FIG. 3B is a front view of the embodiment of the edge device;

FIG. 4 is a front view of an alternate embodiment of an edge device; and

DETAILED DESCRIPTION

Figure 1:
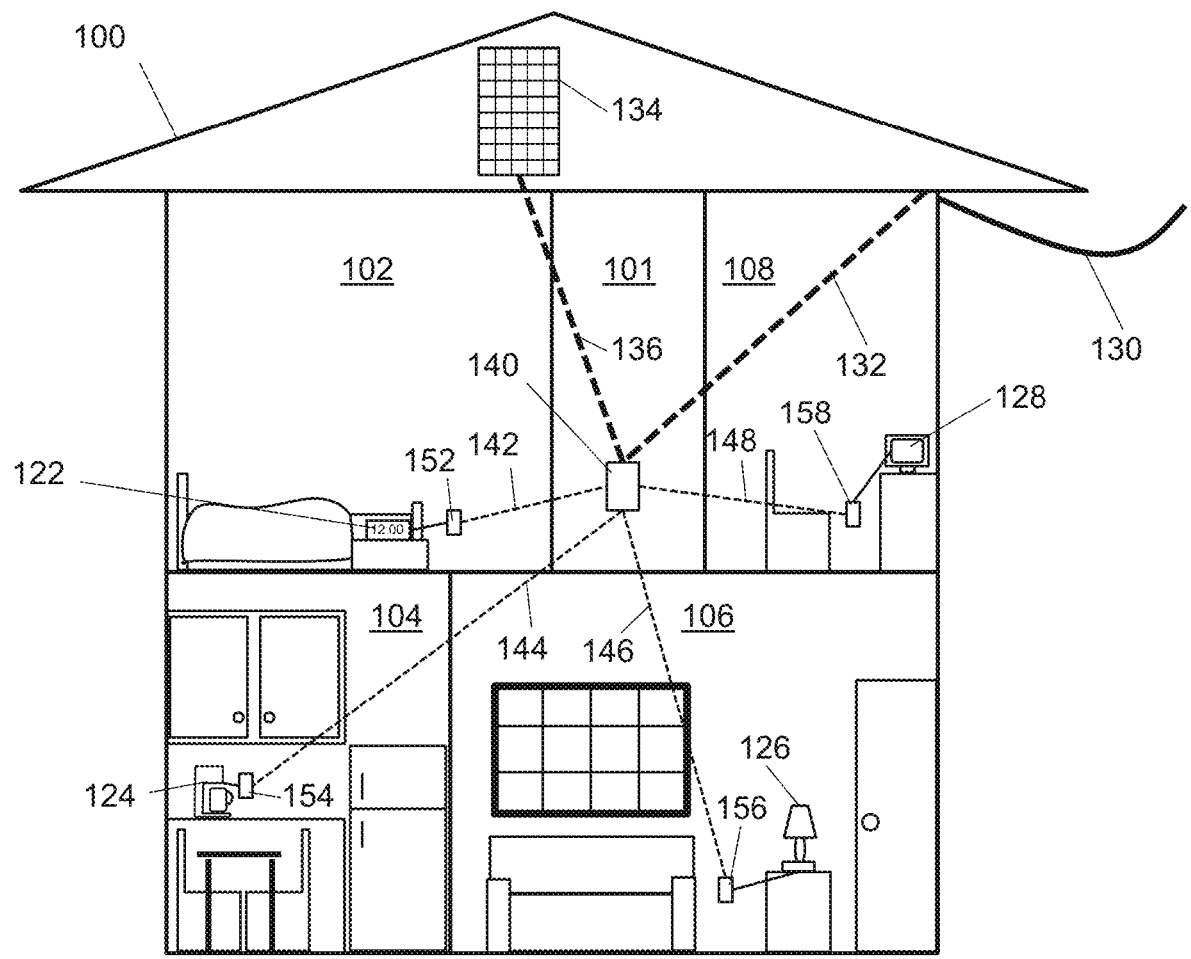
FIG. 1 shows a stylized view of a home utilizing an embodiment of a power distribution system.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure.

A transition of infrastructure from AC to DC provides an opportunity for major changes in paradigm. It is currently very difficult for innovative home power distribution solutions to gain a foothold due to the regulatory environment (i.e. electrical codes) and the existing base of contractors and electricians which are rooted in the traditional infrastructure.

Embodiments are described herein that utilize existing cost-effective components and technologies but apply them in an innovative way to provide DC power within a building while easily co-existing with traditional AC power distribution to create a transition path which allows more and more devices to utilize native DC power. DC power, as the term is used herein, may include embodiments where the current is not continuous, but may vary over time, including pulse-width modulated DC power where the current is switched on and off at various frequencies and/or duty-cycles. One issue with traditional technologies is that power over Ethernet (PoE) cannot provide as much power as common electronic devices, such as televisions, computers, and stereo systems, require. Many versions of PoE are not even able to provide as much power as common connectors, such as the USB-C connector (capable of up to 100 W), can provide.

Embodiments of a device, hereinafter referred to as an edge device, may receive DC power through a single cable, such, but not limited to, what is commonly called an Ethernet cable, having several conductors of relatively small gauge (i.e. smaller than a traditional AC power distribution cable which is 14 AWG or larger) and provide a connector to be used by a DC-powered device. The edge device may be sized to fit into a standard single-gang electrical junction box and include a standard connector accessible when installed, such as a USB connector (e.g. a standard or micro USB-A connector or a USB-C connector), a barrel connector, or an RJ-style connector that can be used by a DC-powered device as its power source.

Any type of cable may be used to distribute the DC power to the edge device (i.e. the distribution cable), but in at least some embodiments a cable designed for use with an Ethernet network may be used. Several types of Ethernet cables are defined including, but not limited to, category 3 (cat3), category 5 (cat5), category 5e (cat5e), category 6 (cat6), and category 7 (cat7) cables. Ethernet cables may be specified by the ANSI/TIA/EIA-568 standard, which is incorporated by reference herein. The most recent version of this standard (version D) can be purchased at https://global.ihs.com/doc_detail.cfm?item_s_key=00378460 as of the date of filing of this application. In other embodiments, the distribution cable may be any other type of cabling, such as cabling designed for telephony use, lamp cord, or other types of insulated wire. The distribution cable can have any number of conductors, but typically may include 2-8 conductors having a size of 16 AWG or smaller. Ethernet cables typically have 8 conductors of 22-24 AWG.

In some embodiments, a different mechanical form-factor may be used for the edge device. A traditional electrical junction box may not be required, allowing other form factors to be used. In some embodiments, the edge device may be directly mountable into a hole cut into drywall material as the isolation requirements for high power class 1 power doesn't apply and Ethernet could be plugged in directly from behind a drywall. In other embodiments, the edge device may be configured to fit into a cavity having different dimensions than a standard electrical junction box, and may be smaller, larger, and/or have a different aspect ratio.

Some embodiments of the edge device may accept power to be provided by a standard PoE injector or a PoE enabled switch device through a standard RJ-45 Ethernet connector. In other embodiments, an AC-to-DC power supply or a DC power source (e.g. a battery, a DC-to-DC converter, or a photovoltaic panel) may be used to provide power to the distribution cable powering the edge device and the distribution cable may connect to the edge device using any type of connector, including, but not limited to, a barrel connector, a USB connector, an RJ11/RJ14/RJ25 connector, an HDMI connector, or a pin and socket connector. In some embodiments, contacts may be provided by the edge device to allow the wires of the distribution cable to be soldered or otherwise attached to the edge device (e.g. screw attachment or spring-loaded contacts).

Some edge devices may also provide communications capability, such as an RJ-45 Ethernet network connector or an HDMI connector to provide digital video. Depending on the embodiment, the same connector may be used to provide DC power and the communications capability, or separate connectors may be used. In at least one embodiment, the edge device communicates over a wired network through the distribution cable used to provide the edge device with DC power, and the edge device communicates with other devices wirelessly, using any version of IEEE 802.11, any version of IEEE 802.15, any version of Bluetooth, or any other wireless communication protocol using any frequency, including radio-frequency signals and optical signals. The edge device may communicate wirelessly with another device directly, or through intermediate devices such as in a wireless mesh network, depending on the embodiment. Other embodiments may provide an interface to a peripheral, such as a printer interface, a hard drive interface, an audio adapter to provide audio to an amplifier or speaker, or a display, to provide network devices access to the peripheral as a network resource. In another embodiment, a data storage device, such as a solid-state drive or a hard drive may be included in the edge device to provide network attached storage (NAS) to network devices. In at least one embodiment, the edge device may include an Ethernet to USB adapter, so that a USB device plugged into the edge device could show up as an Ethernet device over the distribution cable. In some embodiments, the positions of the edge devices may be used to pinpoint the location of other devices using wireless positioning systems.

In some embodiments, a battery, fuel cell, supercapacitor, or other energy storage device may be coupled to the edge device. Non-limiting examples of where the energy storage device may be located include integrated into the edge device, co-located with the edge device in a junction box, located its own receptacle in the wall near the edge device, external to the edge device and electrically coupled to the edge device by a cable other than the distribution cable. A battery used as such may be based on any battery chemistry, including, but not limited to, zinc-air, lead-acid, lithium-ion, or lithium-polymer, and may or may not be rechargeable. In embodiments, the energy storage device may allow the edge device to source more power than it is receiving for a period of time, acting as a power cache. As a non-limiting example, a rechargeable battery coupled to the edge device may allow the edge device to provide 100 W of power to charge a notebook computer in one hour even though, even though the edge device is only receiving 60 W of power through its attached distribution cable. As another non-limiting example, an edge device receiving 30 W of power through its attached distribution cable may be able to source 60 W of power by using an attached fuel cell to augment the power received through its distribution cable until the fuel in the fuel cell is depleted. If the energy storage device is rechargeable, the edge device may have bimodal power capability, sourcing a first level of power not exceeding the power provided through the distribution cable if the energy storage device is discharged, and a second, higher level of power using energy from the energy storage device to supplement the power provided through the distribution cable. As another non-limiting example, the edge device may provide a USB-C connector for power to a load that can provide up to 100 W if the attached rechargeable battery is charged, but may be limited to the 30 W available from its distribution cable once the batter is discharged. Once the load drops below 30 W, the power received from the distribution cable which is not provided to the load may be used to recharge the battery. Additionally, the attached energy storage device may allow the edge device to continue to provide power to its load even if there is an interruption of the power received through the distribution cable due to a power failure, overload of the power supply supporting the distribution cable, or other cause.

In some embodiments, a connector used to provide power to a load may be integrated with the energy storage device. The energy storage device with integral connector maybe removable from the edge device and may be used to provide power to a load, such as a computer, a television or an amplified speaker, at a location separated from the edge device. This may allow for easy mobility of devices that don't include an integrated battery. In some embodiments, the removable battery may be recharged while removed from the edge device to allow faster charging from an alternative power source. In some embodiments, a removable energy storage device may be replaceable while the edge device is providing power to its load to allow the edge device to provide high power for a longer period of time. In such edge devices, a second smaller energy storage device may be integrated into the edge device (or otherwise coupled to the edge device) to allow continuous power during the replacement of the removable energy storage device. To help minimize the issue of the removable energy storage device being misplaced, some embodiments, may include a button on the edge device or on the receptacle for the energy storage device that triggers an alert (e.g. audible noise or flashing light) by activating a transducer on the removable energy storage device.

In some embodiments, edge devices with energy storage devices may be linked together with wires other than the distribution cable to allow stored energy to be shared between edge devices. This capability may be used to provide high power output for a longer period of time than could otherwise be sustained or to allow the energy storage device in one edge device to be replaced while providing continuous high power output. In some embodiments, a mesh of edge devices may be created allowing stored energy from a plurality of edge devices to be provided to a particular edge device, even if some of them are not directly connected. This would allow the edge devices to act as a mini power-grid. In some embodiments, a separate controller may be used to communicate with the edge devices to manage the grid and how energy is transferred between edge devices, but in other embodiments, software running on one or more of the edge devices may be able to control the grid.

In some embodiments, energy storage devices may allow edge devices to continue to provide the minimum-rated power even if the power available through their distribution cable is lower than expected or interrupted (i.e. a power outage). In some cases, the power source for the distribution cables may not be able to provide the full rated power to every edge device. One example of this is a photovoltaic device which may have variable power output depending on the amount of sunlight it is receiving. Energy storage devices may allow the edge device to continue to provide power when the sun is temporarily occluded by a passing cloud or even to continue to provide power after the sun sets. Use of a mesh of edge devices with attached energy storage in a photovoltaic system may allow for a significant amount of stored energy which may allow the edge devices to continue to source power throughout the night. In another example, a power supply used to provide power the distribution cables may have a total power limit below that of the combined power limits of each individual distribution cable. Use of energy storage devices may allow the edge devices to continue to provide power even when the total power of their combined loads exceeds the total power limit of the power supply.

Some embodiments of the edge device may include a DC-to-AC converter or inverter and a traditional AC power outlet (e.g. a NEMA 5-15) to allow the edge device to provide power to conventional AC-powered devices. In some embodiments, an energy storage device may be used in conjunction with the DC-to-AC converter to allow short-duration high-power devices such as toasters, hair dryers, or microwave ovens, to be powered by the edge device.

In some embodiments, the edge device may provide wireless power using electric field induction, magnetic inductive coupling, magnetic resonant coupling, radio-frequency transmission, laser transmission, or any other technology for wireless transmission of power between two devices. Non-limiting examples of magnetic inducting coupling for wireless power transmission include a Qi interface as defined by the Wireless Power Consortium and AirFuel Inductive charging as defined by the AirFuel™ Alliance. A non-limiting example of magnetic resonant coupling is an AirFuel Resonant system as defined by the AirFuel Alliance.

Reference now is made in detail to the examples illustrated in the accompanying drawings and discussed below.

FIG. 1 shows a stylized view of a home 100 utilizing an embodiment of a power distribution system. While a home 100 is shown, the concepts and devices could be used in any type of commercial, industrial, or residential building. The home 100 includes several rooms, including a utility closet 101, a bedroom 102, a kitchen 104, a living room 106, and an office 108. The home receives power from a utility through a utility line 130. The power from the utility can be any type of electrical power, but may be single phase, two phase, or three phase AC power in various embodiments. The home 100 also includes a solar panel 134 to generate DC power locally.

The utility power line 130 may be coupled, through cable 132 which may be hidden in the walls of the home 100, to a DC distribution unit 140 which is located in the utility closet 101 in this example, but could be located anywhere in a building. The DC distribution unit 140 may convert the AC power from the utility to DC power. The solar panel 134 may also be coupled, through cable 136, to the DC distribution unit 140.

The DC distribution unit 140 may provide DC power to one or more edge devices 152-158 through distribution cables 142-148. The distribution cables 142-148 may be routed through the walls or other structure of the home 100 to hide them from view. The distribution cables 142-148 may be any type of cable with any number of conductors of any size, depending on the embodiment. In some embodiments, the distribution cables 142-148 may utilize cables targeted of use with Ethernet networking and may include 8 conductors of 22-24 AWG. Any number of conductors in the distribution cables 142-148 may be used to carry the electrical power but in some cases the power may be distributed in accordance with power-over-Ethernet consistent with IEEE 802.3af, IEEE 802.3at, or IEEE 802.3bt. The edge devices 152-158 may include a connector positioned to be hidden within the wall while the edge device is mounted into the wall that couples to the distribution cables 132-148.

Edge devices 152-158 may be configured to be mounted in a standard single-gang electrical junction box in the walls of the home 100, although other embodiments may be configured to mount on the outside of a wall or as a separate device to sit on the floor or a piece of furniture. The edge devices 152-158 may also include an accessible connector, that is a connector positioned to be exposed while the edge device is mounted into the wall, to provide DC power to another device, such as the example devices shown. Clock radio 122 is coupled to edge device 152, coffee maker 124 is coupled to edge device 154, lamp 126 is coupled to edge device 156, and monitor 128 is coupled to edge device 158.

In some embodiments, additional cables (not shown in FIG. 1) may be used to couple edge devices 152-158 directly to other edge devices to create a mesh of edge devices. This may allow an edge device to provide more power to it load, such as coffee maker 124, than it could otherwise source from its single connection to the DC distribution unit 140. In some embodiments, the edge devices 152-158 may include energy storage devices which can provide additional power for limited periods of time to augment the power received through the edge devices' 152-158 distribution cable 142-148.

Figure 2A:
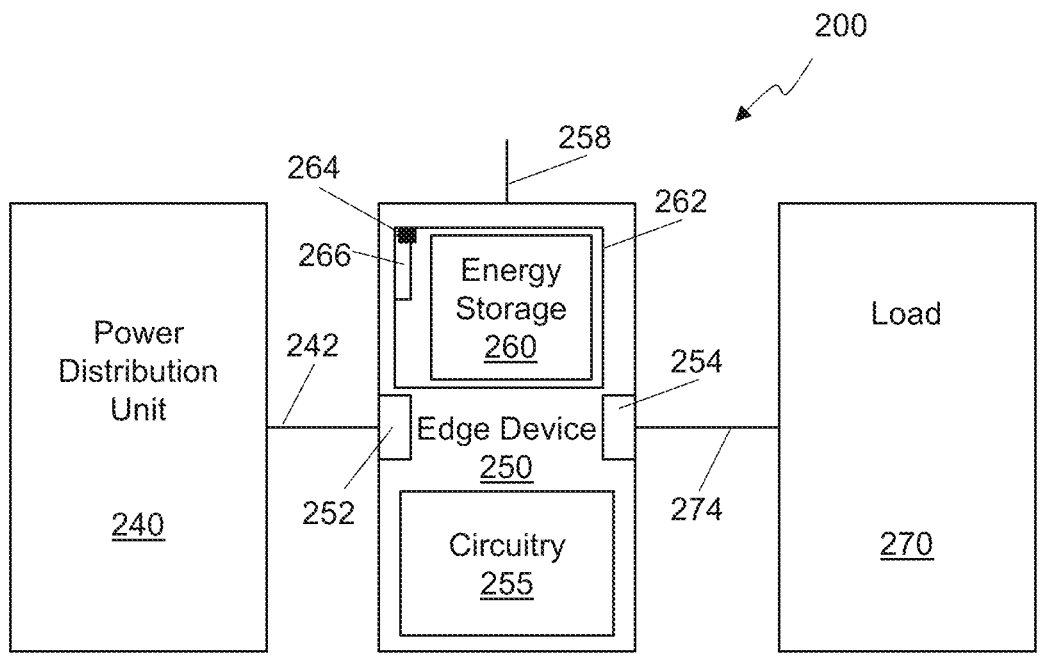
FIG. 2A shows block diagram of an embodiment of the power distribution system.

FIG. 2A shows block diagram of an embodiment of the power distribution system 200. The system 200 includes a power distribution unit 240, which may be similar to the DC distribution unit 140 of FIG. 1. The power distribution unit 240 receives power from a utility, a local power generator (e.g. a solar cell or windmill), or local energy storage, and distributes DC power over a distribution cable 242 to an edge device 250. One power distribution unit 240 may be able to provide power to any number of edge devices, depending on the embodiment. The power distribution unit 240 may have intelligent control to determine where to best draw power at any given time and may also include control of charging a bank of batteries, using low cost power (e.g. local solar cells or off-peak utility power) to charge the batteries and using stored battery power during peak load periods.

The edge device 250 may include a first connector 252 to mate with the distribution cable 242 and receive DC power and a second connector 254 to provide power to a load 270 through a power cable 274. The first connector 252 may be positioned to be hidden within the wall while the edge device 250 is mounted into the wall and the second connector 254 may be positioned to be exposed and accessible to a user while the edge device 250 is mounted into the wall. The first connector 252 and second connector 254 may be any type of connector, depending on the embodiment, but in some embodiments, the first connector may be an RJ-45 connector compatible with an Ethernet cable using power-over-Ethernet (PoE) and the second connector 254 may be a communication connector of some type, such as, but not limited to, a USB-C connector, a USB-A connector, an HDMI connector, or an RJ-type connector. In some embodiments, communication circuitry (which may be a part of circuitry 255) may be coupled between the first connector 252 and the second connector 254 to provide for data communication between the two connectors 252, 254. The communication circuitry may be any type of circuitry including circuitry to perform translation between data protocols, but in some embodiments, the communication circuitry may consist only of passive components, such as, but not limited to conductors, resistors, capacitors, and/or inductors. The edge device 250 may be able to provide any amount of DC power to the load 270, depending on the embodiment, but in some embodiments, up to 100 W may be provided to the load.

Figure 2B:
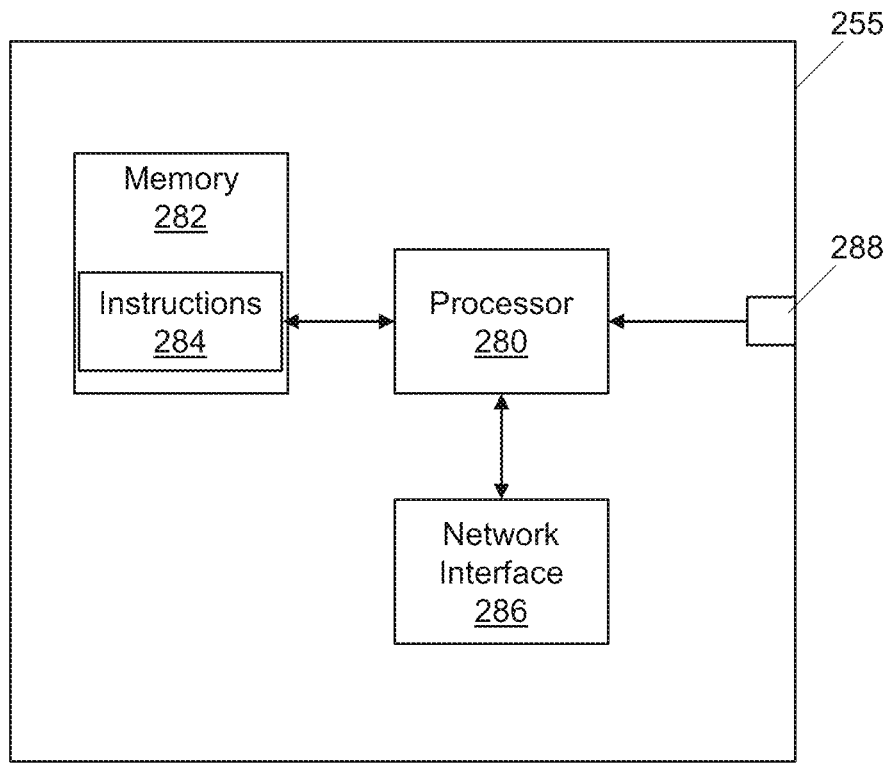
FIG. 2B shows block diagram of an embodiment of circuitry of an edge device.

The edge device 250 includes circuitry 255 to manage the power received through the first connector 252 and provided through the second connector 254. The circuitry 255 may convert the voltage level, modulation, or other characteristics of the received DC power before it is sent to the load 270. For example, the receive power may have a voltage level of around 50 V which is commonly used for PoE, but the output power provided to the second connector 254 may be limited to 5V if a USB-A connector is used, so the circuitry 255 may include voltage regulation such as a DC-to-DC converter. In other embodiments, current regulation may be included in the circuitry 255 and in yet other embodiments, modulation, such as pulse-width modulation may be performed by the circuitry 255 on the power provided to the second connector 254. In some embodiments, such as the embodiment shown in FIG. 2B, the circuitry 255 may include a processor 280 and memory 282 storing instructions 284 for the processor 280. A network interface 286 providing for communication with other edge devices through the other connection 258 and/or with the power distribution unit 240 through the first connector 252 may also be included.

The edge device 250 may include energy storage 260 in some embodiments. The energy storage 260 may include one or more batteries (rechargeable or non-rechargeable), one or more capacitors (including so-called super-capacitors), a fuel cell, or any other type of energy storage 260. The energy storage 260 may be integrated into the edge device 250 or may be separate from the edge device 250 and may be removable in some embodiments. The circuitry 255 may manage the energy storage device 250 to determine when to charge and when to draw power from the energy storage device 260. In some embodiments, the energy storage 260 may be housed in an enclosure 262 that is removeable from the edge device 250 that may also include a transducer 264, such as an LED, a speaker, or a vibrator, and alert circuitry 266, coupled to the transducer 264 to receive a wireless signal from the circuitry 255 and activate the transducer 264 to emit light, make a sound, or vibrate, in response to receiving the wireless signal. The circuitry 255 may include a user input device 288, such as a button or any other type of input, and notification circuitry (which may be the same as the network interface 286 or a separate wireless transmitter), coupled to the user input device 288, to send a wireless signal in response to an input received from the user input device 288 to help a user find the energy storage 260 if it has been removed from the edge device 250.

The edge device 250 may have one or more other connections 258 (which may coupled through connectors) which allow the edge device to connect to other edge devices and/or other energy storage devices. The edge device 250 may be a part of a mesh of edge devices allowing power to be provided from another edge device to the edge device 250 or vice versa. The circuitry 255 may manage the participation of the edge device 255 in the mesh. Thus, the circuitry 255 may control the flow of DC power from the other connection 258 to the second connector 254 and on to the load 270 and/or the flow of DC power between the other connection 258 and the energy storage 260.

In some embodiments, the circuitry 255 may include a network interface 286 coupled to the other connection 258 and a processor 280 coupled to the network interface 286. The processor 286 may be programmed to communicate with at least one other processor through the network interface to determine whether to send or receive DC power through the other connection 258 and to send DC power from the energy storage device 260 through the other connection at a first time in response to a determination to send DC power. The processor may further be programmed to determine how to utilize the DC power received from the other connection 258 based on at least one of a state of the energy storage 260 or a power requirement from the load 270 coupled to the second connector 254, in response to a determination to receive DC power and send at least some of the DC power received from the other connection 258 to the energy storage 260 at a second time. The processor may also be programmed to send at least some of the DC power received from the other connection 258 to the second connector 254 at a third time.

In embodiments of some systems 200, the processor 280 may be programmed to determine how to utilize the DC power received from the power distribution unit 240 through the first connector 252 based on at least one of a state of the energy storage 260 or a power requirement from the load 270 coupled to the second connector 254. The processor 280 may then send a first portion of the DC power received through the first connector 252 to the energy storage 260 and send the rest (i.e. a remaining portion) of the DC power received through the first connector 252 to the load 270 through the second connector 254. This may be done simultaneously or sequentially.

The power distribution unit 240 and the edge device 250 may be in communication with each other in some embodiments. The communication may take place through the distribution cable 242 and may use any communication protocol, but in some cases, an IEEE 802.3 (i.e. Ethernet) protocol, may be used over two or more twisted pairs in an Ethernet cable used as the distribution cable 242. In at least one embodiment, power delivery in compliance with IEEE power over Ethernet standards is negotiated for power delivered over the twisted pairs used for 10BASE-T or 100BASE-TX (mode A) while power for charging the energy storage 260 is delivered over the other two twisted pairs in a way that may not be compliant with IEEE standards. This may be used in conjunction with embodiments disclosed in related U.S. patent application Ser. No. 16/455,975 entitled "Remote Dimming of Lighting" filed on Jun. 28, 2019, which is incorporated by reference herein. The power received on the data pairs may be used to power the load 270, which may be LED lighting, and the power may be modulated by the power distribution unit 240 to control the brightness of the lighting. If the edge device 250 detects that power is no longer being supplied by the power distribution unit 240, it may then supply power from the energy storage 260 back to the power distribution unit 240 which can use that power it receives from the edge device 250 and/or other edge devices to continue to function and to route the power to the appropriate edge devices for emergency lighting. The detection of the power loss event may take place by the circuitry 255 in the edge device 250 by recognizing that power is no longer being supplied through one or more pins of the first connector 252, or by receiving an alert through the distribution cable 242 from the power distribution unit 240. The alert can take the form of a simple signal provided through the distribution cable (e.g. pulling a pin high or low) or by sending a message using a communication protocol (e.g. Ethernet or RS-232) through the distribution cable.

FIG. 3A is a back perspective view and FIG. 3B is a front view of an embodiment of an edge device 300. The edge device 300 may be comparable to the edge device 250 of FIG. 2A and is adapted to fit into a single-gang electrical junction box, as described by the National Electrical Manufacturers Association (NEMA) WD 6-2016 specification, although other embodiments may have other form-factors. The NEMA WD 6-2016 specification, which is incorporated by reference herein, could be downloaded from https://www.nema.org/Standards/Pages/Wiring-Devices-Dimensional-Specifications.aspx as of the date of filing of this application. An edge device that has a size and shape to fit into a single gang electrical box may have a body with maximum dimensions of about 4.45 centimeters (cm) by about 7.14 cm and a depth of about 9 cm or less (1.75× 2.82×3.5 inches) and having a mounting yoke 302 with mounting holes 304 spaced about 8.33 cm (3.28 inches) apart although some embodiments may be somewhat larger. The edge device 300 includes a first connector 310 on the back to mate with a distribution cable to receive power. The power may be DC power and may be consistent with power-over-Ethernet (PoE) in some embodiments. In the embodiment shown, connector 310 is an RJ-45 socket compatible with PoE. The front of the edge device 300 includes at least a second connector which is accessible while the edge device 300 is mounted into a wall, with this embodiment including two USB-C sockets 320 and two USB-A sockets 330. In embodiments, the data capabilities of the USB-C sockets 320 and USB-A sockets 330 may or may not be used, with some embodiments only using the sockets 320, 330 to provide DC power. The USB-C sockets 320 may be able to provide up to 100 W of power to a load device in some embodiments but the USB-A sockets 330 may be limited to lower power loads, such as 15 W.

FIG. 4 is a front view of an alternate embodiment of an edge device 400. The back of edge device 400 may be identical or similar to the back of edge device 300 or may be different with additional connections, depending on the embodiment. The edge device 400 receives DC power from a distribution cable and provides DC power through the two USB-C sockets 420 on the front. In addition, the edge device 400 includes DC-to-AC conversion circuitry (e.g. an inverter) to generate 110 VAC power to provide to outlet 450. In some embodiments, the current capability of the outlet 450 may be lower than a traditional 15A outlet and some embodiments, may include a circuit breaker and/or overload indicator on the edge device 400.

Aspects of various embodiments are described with reference to flowchart illustrations and/or block diagrams of methods, apparatus, systems, and computer program products according to various embodiments disclosed herein. It will be understood that various blocks of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and/or block diagrams in the figures help to illustrate the architecture, functionality, and operation of possible implementations of systems, methods and computer program products of various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 5:
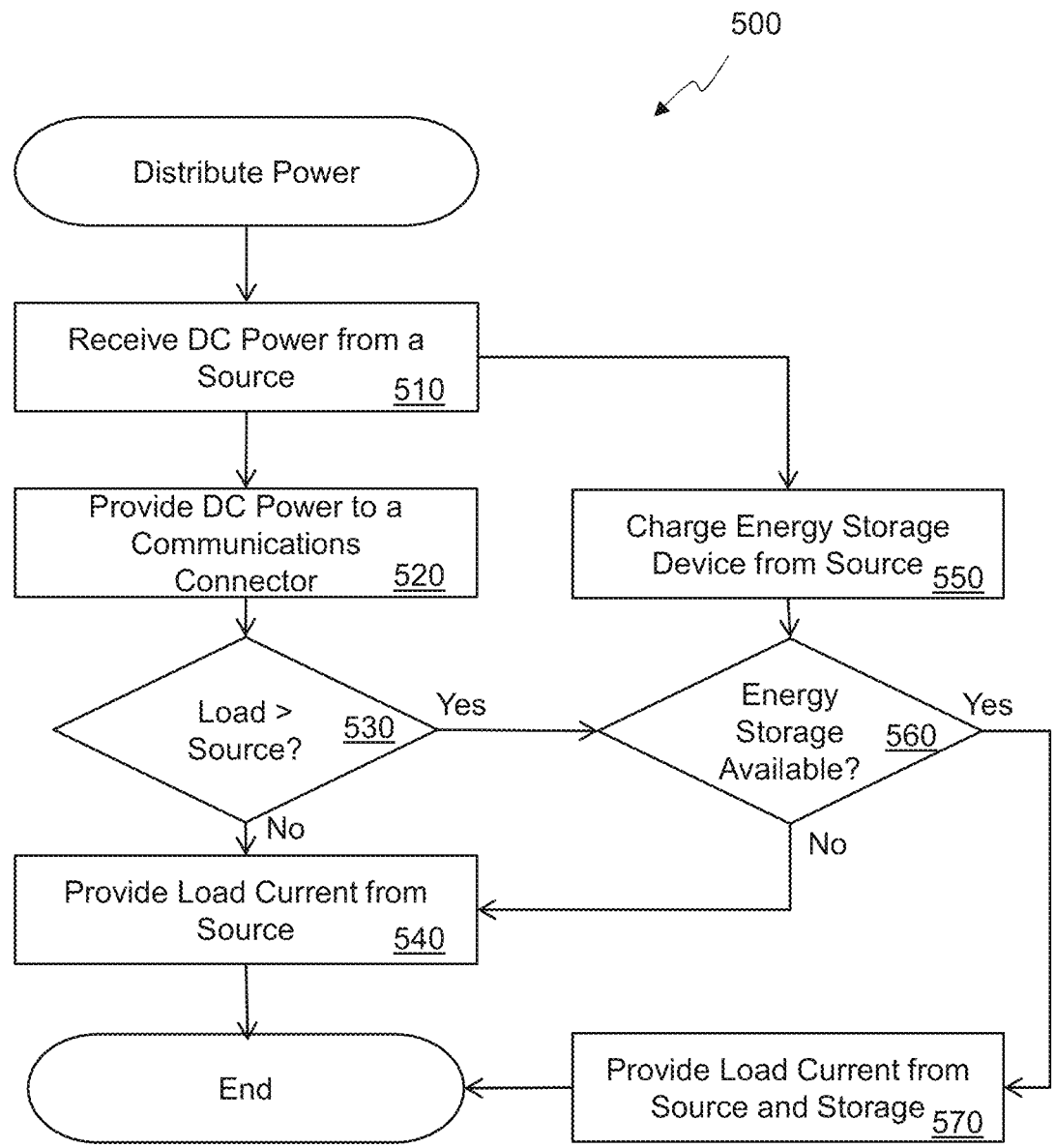
FIG. 5 is a flowchart of an embodiment of a method of distributing power.

FIG. 5 is a flowchart 500 of an embodiment of a method of distributing power. The flowchart 500 begins by receiving 510 direct-current (DC) power from a source. The DC power may be continuous, varying, pulse-width modulated, or switched, or otherwise controlled, depending on the embodiment. The power may be received over a cable with conductors smaller than 14 AWG and may be limited to a safe voltage, current, and/or power level under safety rules from agencies such as Underwriters Laboratories (UL), International Electrotechnical Commission (IEC), CSA Group, or other private or governmental organizations. In some embodiments, the voltage may be kept under 42.4 V and/or the power may be kept under 100 W. In some embodiments, the power may be received from a power-over-Ethernet (PoE) cable.

The flowchart 500 continues with providing DC power 520 to a communications connector, such as a USB connector, an HDMI connector, an RJ style connector, or other connector standardized for carrying communication data as well as having the capability to provide power. In some embodiments, a check may be made to see if a load connected to the communications connector is attempting to draw more power than can be provided by the source 530. If the source power is adequate to provide the desired load, the load current is provided 540 from the source current. In some embodiments, a conversion of the voltage or current level and/or a modulation of the DC power may be done to convert the source current to the load current. In at least one embodiment, a standard AC waveform may be generated from the source current and provided through a standard NEMA outlet instead of or in addition to providing power to the communication connector.

In some embodiments, an energy storage device, such as a battery, may be charged 550 from the DC power received. If it is determined that the load current is greater than the current available from the source 530, the availability of energy storage 560 may be checked. The energy storage may be local or remote. If energy from the energy storage is not available, whatever load current can be provided may be provided 540 to load from the source, although other embodiments may shut off the current to the load if the desired current cannot be provided. If energy is available from the energy storage device 560, current from the energy storage device may be used to augment the current from the source to provide 570 current to the load.

As will be appreciated by those of ordinary skill in the art, aspects of the various embodiments may be embodied as a system, device, method, or computer program product apparatus. Accordingly, elements of the present disclosure may take the form of an entirely hardware embodiment, an entirely software embodiment (including firmware, resident software, micro-code, or the like) or an embodiment combining software and hardware aspects that may all generally be referred to herein as a "server," "circuit," "module," "client," "computer," "logic," or "system," or other terms. Furthermore, aspects of the various embodiments may take the form of a computer program product embodied in one or more computer-readable medium(s) having computer program code stored thereon.

Any combination of one or more computer-readable storage medium(s) may be utilized. A computer-readable storage medium may be embodied as, for example, an electronic, magnetic, optical, electromagnetic, infrared, or semiconductor system, apparatus, or device, or other like storage devices known to those of ordinary skill in the art, or any suitable combination of computer-readable storage mediums described herein. In the context of this document, a computer-readable storage medium may be any tangible medium that can contain, or store a program and/or data for use by or in connection with an instruction execution system, apparatus, or device. Even if the data in the computer-readable storage medium requires action to maintain the storage of data, such as in a traditional semiconductor-based dynamic random access memory, the data storage in a computer-readable storage medium can be considered to be non-transitory. A computer data transmission medium, such as a transmission line, a coaxial cable, a radio-frequency carrier, and the like, may also be able to store data, although any data storage in a data transmission medium can be said to be transitory storage. Nonetheless, a computer-readable storage medium, as the term is used herein, does not include a computer data transmission medium.

Computer program code for carrying out operations for aspects of various embodiments may be written in any combination of one or more programming languages, including object oriented programming languages such as Java, Python, C++, or the like, conventional procedural programming languages, such as the "C" programming language or similar programming languages, or low-level computer languages, such as assembly language or microcode. The computer program code if loaded onto a computer, or other programmable apparatus, produces a computer implemented method. The instructions which execute on the computer or other programmable apparatus may provide the mechanism for implementing some or all of the functions/acts specified in the flowchart and/or block diagram block or blocks. In accordance with various implementations, the program code may execute entirely on the user's computer, partly on the user's computer, as a standalone software package, partly on the user's computer and partly on a remote computer or entirely on the remote computer or server, such as a cloud-based server. In the latter scenario, the remote computer may be connected to the user's computer through any type of network, including a local area network (LAN) or a wide area network (WAN), or the connection may be made to an external computer (for example, through the Internet using an Internet Service Provider). The computer program code stored in/on (i.e. embodied therewith) the non-transitory computer-readable medium produces an article of manufacture.

The computer program code, if executed by a processor causes physical changes in the electronic devices of the processor which change the physical flow of electrons through the devices. This alters the connections between devices which changes the functionality of the circuit. For example, if two transistors in a processor are wired to perform a multiplexing operation under control of the computer program code, if a first computer instruction is executed, electrons from a first source flow through the first transistor to a destination, but if a different computer instruction is executed, electrons from the first source are blocked from reaching the destination, but electrons from a second source are allowed to flow through the second transistor to the destination. So a processor programmed to perform a task is transformed from what the processor was before being programmed to perform that task, much like a physical plumbing system with different valves can be controlled to change the physical flow of a fluid.

Examples of various embodiments are described in the following paragraphs:

Embodiment 1. An apparatus comprising: an energy storage device; a mechanical structure configured to hold the energy storage device and mount into a wall of a building; a first connector positioned to be hidden within the wall while the apparatus is mounted into the wall; a second connector, coupled to the energy storage device, and positioned to be exposed while the apparatus is mounted into the wall; and charging circuitry, coupled to the first connector and the energy storage device, to provide direct-current (DC) power received from the first connector to the energy storage device.

Embodiment 2. The apparatus of embodiment 1, further comprising communication circuitry coupled between the second connector and the first connector to provide for data communication between the second connector and the first connector.

Embodiment 3. The apparatus of embodiment 2, wherein the communication circuitry consists of only passive components.

Embodiment 4. The apparatus of any of embodiments 1 through 3, further comprising a data storage device coupled to the second connector to provide data storage for an external device coupled to the second connector.

Embodiment 5. The apparatus of any of embodiments 1 through 4, wherein the energy storage device comprises a rechargeable battery.

Embodiment 6. The apparatus of any of embodiments 1 through 5, wherein the energy storage device comprises a capacitor.

Embodiment 7. The apparatus of any of embodiments 1 through 6, wherein the mechanical structure has a size and shape to fit into a single gang electrical box.

Embodiment 8. The apparatus of any of embodiments 1 through 7, wherein the second connector is compliant with at least one USB connector mechanical specification.

Embodiment 9. The apparatus of any of embodiments 1 through 8, wherein the second connector is compliant with a female USB-C connector mechanical specification.

Embodiment 10. The apparatus of any of embodiments 1 through 7, wherein the second connector is an RJ-45 socket.

Embodiment 11. The apparatus of embodiment 10, wherein the apparatus is compliant with an IEEE power over Ethernet standard as power sourcing equipment.

Embodiment 12. The apparatus of any of embodiments 1 through 11, further comprising a DC-to-DC converter coupled between the energy storage device, which provides power at a first voltage, and the second connector to provide DC power to the second connector at a second voltage that is different than the first voltage.

Embodiment 13. The apparatus of any of embodiments 1 through 7, further comprising inverter circuitry coupled to the energy storage device and the second connector to provide alternating-current (AC) power to the second connector.

Embodiment 14. The apparatus of embodiment 13, wherein the second connector is compliant with standard to provide AC power.

Embodiment 15. The apparatus of any of embodiments 1 through 14, wherein the first connector is an RJ-45 socket.

Embodiment 16. The apparatus of any of embodiments 1 through 15, wherein the apparatus is compliant with an IEEE power over Ethernet standard as a powered device.

Embodiment 17. The apparatus of any of embodiments 1 through 16, wherein the energy storage device is removable from the mechanical structure without tools.

Embodiment 18. The apparatus of any of embodiments 1 through 17, further comprising an enclosure holding the energy storage device, the enclosure removable from the mechanical structure without tools and further comprising: a transducer; and alert circuitry, coupled to the transducer, to receive a wireless signal and activate the transducer in response.

Embodiment 19. The apparatus of embodiment 18, further comprising: a user input device; and notification circuitry, coupled to the user input device, to send the wireless signal to the alert circuitry in response to an input received from the user input device.

Embodiment 20. The apparatus of any of embodiments 1 through 19, further comprising a third connector coupled to the to the charging circuitry, wherein the charging circuitry is configured to also provide direct-current (DC) power received from the third connector to at least one of the energy storage device or the second connector.

Embodiment 21. The apparatus of any of embodiments 1 through 20, further comprising a third connector coupled to the to the charging circuitry, wherein the charging circuitry is configured to also provide direct-current (DC) power from the energy storage device to the third connector.

Embodiment 22. The apparatus of any of embodiments 1 through 21, further comprising a third connector coupled to the to the charging circuitry, the charging circuitry comprising: a network interface coupled to the third connector; a processor coupled to the network interface and programmed to: communicate with at least one other processor through the network interface to determine whether to send or receive DC power through the third connector; send DC power from the energy storage device through the third connector at a first time in response to a determination to send DC power; determine how to utilize the DC power received from the third connector based on at least one of a state of the energy storage device or a power requirement from an external device coupled to the second connector, in response to a determination to receive DC power; send at least some of the DC power received from the third connector to the energy storage device at a second time; and send at least some of the DC power received from the third connector to the second connector at a third time.

Embodiment 23. The apparatus of any of embodiments 1 through 22, the charging circuitry comprising a processor programmed to: determine how to utilize the DC power received from the first connector based on at least one of a state of the energy storage device or a power requirement from an external device coupled to the second connector; send a first portion of the DC power received from the first connector to the energy storage device; and send a remaining portion of the DC power received from the first connector to the second connector.

Embodiment 24. The apparatus of embodiment 23, the processor further programmed to simultaneously send power from both the energy storage device and the first connector to the second connector.

Embodiment 25. The apparatus of any of embodiments 1 through 24, the charging circuitry configured to: detect that power is no longer supplied being supplied through the first connector; and send DC power from the energy storage device through the first connector in response to said detection.

Embodiment 26. The apparatus of any of embodiments 1 through 25, the charging circuitry configured to: receive an alert through the first connector; and send DC power from the energy storage device through the first connector in response to the alert.

Embodiment 27. A method of distributing power, the method comprising: receiving direct-current (DC) power at a first connector of an edge device mounted in a wall of a building at a first power level; storing at least some of the power received at the first power level in an energy storage device; and providing at least some of the power received to an external device through a second connector of the edge device as load power.

Embodiment 28. The method of embodiment 27, further comprising converting at least some of the DC power received into alternating-current (AC) power and providing the AC power to the external device through the second connector.

Embodiment 29. The method of embodiment 27 or 28, further comprising: detecting that the power is no longer being received at the first connector; and sending power from the energy storage device through the first connector in response to said detecting.

Embodiment 30. The method of embodiment 29, wherein the power received at the first connector includes first power delivered over a first set of conductors of the first connector, and second power delivered over a second set of conductors of the first connector; the first power is stored in the energy storage device; and the second power is provided to through the second connector as load power.

Embodiment 31. The method of embodiment 30, wherein the first power is negotiated and received in a way that is compliant with an IEEE power over Ethernet standard.

Embodiment 32. The method of any of embodiments 27 through 31, further comprising: receiving a user input; sending a wireless signal from the edge device to a module holding the energy storage device; providing an alert to the user from the module in response to the wireless signal; wherein the module is positioned in the edge device at a first time when the at least some power received from at the first connector is stored in the energy storage device, and the module is removed from the edge device at the time the user input is received.

Embodiment 33. The method of any of embodiments 27 through 32, further comprising: communicating with at least one other edge device; and routing power between the energy storage device and the at least one other edge device based on the communication.

Embodiment 34. The method of embodiment 33, further wherein the routing power is also based on at least one of a state of the energy storage device or a power requirement from an external device coupled to the second connector.

Embodiment 35. The method of any of embodiments 27 through 34, wherein the at least some of the power provided to the external device is routed from the first connector to the second connector without being stored in the energy storage device.

Embodiment 36. The method of any of embodiments 27 through 35, wherein a percentage of power received at the first power level received stored in the energy storage device is dependent upon a power requirement of the external device.

Embodiment 37. The method of any of embodiments 27 through 36, wherein said storing of at least some of the power received at the first power level in the energy storage device occurs and said providing of at least some of the power received to the external device through the second connector of the edge device as the load power both occur simultaneously.

Embodiment 38. The method of any of embodiments 27 through 37, wherein the storing of at least some of the power received at the first connector in the energy storage device occurs over a first time period, the method further comprising: providing substantially the first level of power received at the first connector during a second time period as load power; and providing at least some of the power stored in the energy storage device during the first time period as load power during the second time period; wherein the load power is provided at a second power level, greater than the first power level, during the second time period.

Embodiment 39. The method of embodiment 38, wherein no power received at the first connector during the second time period is stored in the energy storage device.

Embodiment 40. At least one machine readable medium comprising one or more instructions that in response to being executed on a computing device cause the computing device to carry out a method according to any one of embodiments 27 to 39.

Embodiment 41. A power distribution system comprising: a direct-current (DC) distribution unit; a cable having a first end coupled to the DC distribution unit; an energy storage device; and an edge device comprising: a mechanical structure configured to mount the edge device into a wall of a building; a second connector, coupled to the energy storage device, and positioned to be exposed while the edge device is mounted into the wall; a first connector, coupled to a second end of the cable, and positioned to be hidden within the wall while the edge device is mounted into the wall; and circuitry, coupled to the first connector and the energy storage device, to provide energy received from the second connector to the energy storage device.

Embodiment 42. The system of embodiment 41, wherein the DC distribution unit is compliant with an IEEE power over Ethernet standard as power sourcing equipment.

Embodiment 43. The system of embodiment 41 or 42, wherein the cable comprises only eight conductors, each smaller than 18 AWG.

Embodiment 44. The system of any of embodiments 41 through 43, wherein the edge device includes the energy storage device and the mechanical structure is further configured to hold the energy storage device.

Embodiment 45. The system of any of embodiments 41 through 44, a second energy storage device coupled to the edge device.

Embodiment 46. The system of any of embodiments 41 through 45, wherein the cable is a first cable, the energy storage device is a first energy storage device, and the edge device is a first edge storage device, the system further comprising: a second edge device including the second energy storage device; and a second cable having a first end coupled to the first edge device and a second end coupled to the second edge device; wherein the first edge device includes the first energy storage device and the second edge device includes the second energy storage device.

Embodiment 47. The system of embodiment 46, wherein the first cable and the second cable each comprise only eight conductors, each smaller than 18 AWG.

Embodiment 48. The system of embodiment 46 or 47, the circuitry of the first edge device comprising: a network interface coupled to second cable; a processor coupled to the network interface and programmed to: communicate through the network interface with a processor of the second edge device to determine whether to send or receive DC power through the second cable; send DC power from the energy storage device through the second cable at a first time in response to a determination to send DC power; determine how to utilize the DC power received from the second cable based on at least one of a state of the first energy storage device or a power requirement from an external device coupled to the second connector, in response to a determination to receive DC power; send at least some of the DC power received from the second edge device through the second cable to the first energy storage device at a second time; and send at least some of the DC power received from the second edge device through the second cable to the second connector at a third time.

Unless otherwise indicated, all numbers expressing quantities, properties, measurements, and so forth, used in the specification and claims are to be understood as being modified in all instances by the term "about." The recitation of numerical ranges by endpoints includes all numbers subsumed within that range, including the endpoints (e.g. 1 to 5 includes 1, 2.78, 7C, 3.33, 4, and 5).

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

The description of the various embodiments provided above is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:

1. A DC to DC edge device comprising:
   an energy storage device;
   a mechanical structure configured to hold the energy storage device and mount into a wall of a building;
   a first connector positioned to be connectable to a first direct-current (DC) power cable within the wall while the DC to DC edge device is mounted into the wall;
   a second connector, coupled to the energy storage device, and positioned to be exposed and connectable to a second DC power cable outside of the wall while the DC to DC edge device is mounted into the wall;
   a third connector; and
   charging circuitry, coupled to the first connector, the third connector, and the energy storage device, to provide direct-current (DC) power received from the first connector to the energy storage device, the charging circuitry comprising:
   a network interface coupled to the third connector;
   a processor coupled to the network interface and programmed to:
   communicate with at least one other processor through the network interface to determine whether to send or receive DC power through the third connector;
   send DC power from the energy storage device through the third connector at a first time in response to a determination to send DC power;
   determine how to utilize the DC power received from the third connector based on at least one of a state of the energy storage device or a power requirement from an external device coupled to the second connector, in response to a determination to receive DC power;
   send at least some of the DC power received from the third connector to the energy storage device at a second time; and
   send at least some of the DC power received from the third connector to the second connector at a third time.

2. The DC to DC edge device of claim 1, further comprising communication circuitry coupled between the second connector and the first connector to provide for data communication between the second connector and the first connector.

3. The DC to DC edge device of claim 1, further comprising a data storage device coupled to the second connector to provide data storage for an external device coupled to the second connector.

4. The DC to DC edge device of claim 1, wherein the mechanical structure has a size and shape to fit into a single gang electrical box.

5. The DC to DC edge device of claim 1, wherein the second connector is compliant with at least one USB connector mechanical specification.

6. The DC to DC edge device of claim 1, wherein the second connector is compliant with a female USB-C connector mechanical specification.

7. The DC to DC edge device of claim 1, wherein the second connector is an RJ-45 socket.

8. The DC to DC edge device of claim 7, wherein the DC to DC edge device is compliant with an IEEE power over Ethernet standard as power sourcing equipment.

9. The DC to DC edge device of claim 1, further comprising a DC-to-DC converter coupled between the energy storage device, which provides power at a first voltage, and the second connector to provide DC power to the second connector at a second voltage that is different than the first voltage.

10. The DC to DC edge device of claim 1, wherein the first connector is an RJ-45 socket.

11. The DC to DC edge device of claim 10, wherein the DC to DC edge device is compliant with an IEEE power over Ethernet standard as a powered device.

12. The DC to DC edge device of claim 1, wherein the energy storage device is removable from the mechanical structure without tools.

13. The DC to DC edge device of claim 1, further comprising inverter circuitry coupled to the energy storage device and the second connector to provide alternating-current (AC) power to the second connector;
wherein the second connector is compliant with standard to provide AC power.

14. The DC to DC edge device of claim 1, further comprising a third connector coupled to the charging circuitry, wherein the charging circuitry is configured to also provide direct-current (DC) power received from the third connector to at least one of the energy storage device or the second connector.

15. The DC to DC edge device of claim 1, further comprising a third connector coupled to the charging circuitry, wherein the charging circuitry is configured to also provide direct-current (DC) power from the energy storage device to the third connector.

16. The DC to DC edge device of claim 1, the processor further programmed to:
determine how to utilize the DC power received from the first connector based on at least one of a state of the energy storage device or a power requirement from an external device coupled to the second connector;
send a first portion of the DC power received from the first connector to the energy storage device; and
send a remaining portion of the DC power received from the first connector to the second connector.

17. The DC to DC edge device of claim 16, the processor further programmed to simultaneously send power from both the energy storage device and the first connector to the second connector.

18. The DC to DC edge device of claim 1, the charging circuitry configured to:
detect that power is no longer supplied being supplied through the first connector; and
send DC power from the energy storage device through the first connector in response to said detection.

19. The DC to DC edge device of claim 1, the charging circuitry configured to:
receive an alert through the first connector; and
send DC power from the energy storage device through the first connector in response to the alert.

* * * * *